United States Patent [19]

Tanaka

[11] Patent Number: 5,347,148
[45] Date of Patent: Sep. 13, 1994

[54] SEMI-INSULATING COMPOUND SEMICONDUCTOR DEVICE

[75] Inventor: Kuninobu Tanaka, Kanagawa, Japan

[73] Assignee: Sony Corporation, Japan

[21] Appl. No.: 981,485

[22] Filed: Nov. 25, 1992

[30] Foreign Application Priority Data

Nov. 27, 1991 [JP] Japan .................................. 3-335823

[51] Int. Cl.⁵ ........................................... H01L 27/04
[52] U.S. Cl. .................................... 257/173; 257/174; 257/328; 257/355; 257/356; 257/546; 257/547
[58] Field of Search ............... 257/173, 174, 328, 355, 257/356, 546, 547

[56] References Cited

U.S. PATENT DOCUMENTS 4,044,373 8/1977 Nomiya et al. ..................... 257/373
4,276,556 6/1981 Enomoto et al. .................... 257/547

Primary Examiner—Edward Wojciechowicz
Attorney, Agent, or Firm—Hill, Steadman & Simpson

[57] ABSTRACT

A semi-insulating compound semiconductor device includes an input terminal portion having a protection diode connected thereto and an element formation region and which is provided with a conduction region having the highest potential in the semiconductor device disposed between the input terminal portion and the element formation region. With such an arrangement, low-frequency oscillation of the drain current $I_D$ or drain conductance $g_m$ due to a leak age current from the protection diode connected to the input terminal portion can be prevented from occurring and thus the semi-insulating compound semiconductor device can operate satisfactorily with stabilized characteristics.

10 Claims, 3 Drawing Sheets

SEMI-INSULATING COMPOUND SEMICONDUCTOR DEVICE

BACKGROUND OF THE INVENTION

1. Field of the Invention

The present invention relates to improvements in a semi-insulating compound semiconductor device.

2. Description of the Related Art

Semi-insulating compound semiconductor devices (hereinafter also briefly referred to as "semiconductor device") fabricated with a semi-insulating compound semiconductor substrate (hereinafter also briefly referred to as "substrate") such as the GaAs semiconductor substrate are widely used as linear ICs or digital ICs. Such semiconductor devices are also widely used, in the form for example of the field-effect transistor (FET), in high-frequency amplifiers, frequency dividers, logic ICs, and so on. Usually, the semiconductor device is formed of an input terminal portion and an element formation region, and the input terminal portion is provided with a protection diode for improvement of the withstanding voltage.

Now, it is reported that, when the bias for the input terminal of a semiconductor device is under a certain condition, the drain current ($I_D$) or the drain conductance ($g_m$) oscillates at a frequency around 1 Hz to 1 kHz. Refer to "Low Frequency Oscillation In GaAs IC's", Daniel Miller et al, GaAs IC Symposium-31, pp. 31–34, 1985.

Though the cause of the above phenomenon has not been completely clarified as yet, it is generally understood that a leakage current is injected into the substrate through the protection diode provided at the input terminal portion of the semiconductor device and the leakage current modulates the potential at the interface between the channel operation region of the semiconductor device and the substrate. As a result, the low-frequency oscillation of the drain current $I_D$ or drain conductance $g_m$ occurs. Such low-frequency oscillation, in turn, causes low-frequency noises in a linear IC or malfunction of a digital IC.

SUMMARY OF THE INVENTION

Accordingly, an object of the present invention is to provide a semi-insulating compound semiconductor device capable of preventing occurrence therein of low-frequency oscillation of the drain current $I_D$ or drain conductance $g_m$ due to a leakage current from a protection diode provided at the input terminal portion and operating satisfactorily with stabilized characteristics.

In order to achieve the above object, the semi-insulating compound semiconductor device according to the present invention is characterized in that it comprises an input terminal portion having a protection diode connected thereto and an element formation region and that there is provided a conduction region having a maximum potential in the semiconductor device between the input terminal portion and the element formation region.

In order to absorb the leakage current flowing into the substrate through the protection diode, it is preferred that the conduction region is formed of an n+ layer in which carriers are short-lived. The n+ layer can be formed, for example, by a high-density electron injection technique.

The highest potential in the semiconductor device can be set, for example, to $V_{DD}$.

In the semi-insulating compound semiconductor device of the invention, it is preferred that a voltage of 2 V or above relative to the substrate is set to the bias point of the input terminal portion because, then, the semi-insulating compound semiconductor device positively provides meritorious effects of this invention.

According to the semi-insulating compound semiconductor device of the present invention, since there is provided a conduction region having the maximum potential in the semiconductor device between the input terminal portion and the element formation region, the leakage current flowing into the substrate through the protection diode can be easily absorbed by the conduction region.

DESCRIPTION OF TEE PREFERRED EMBODIMENTS

Figure 1A:
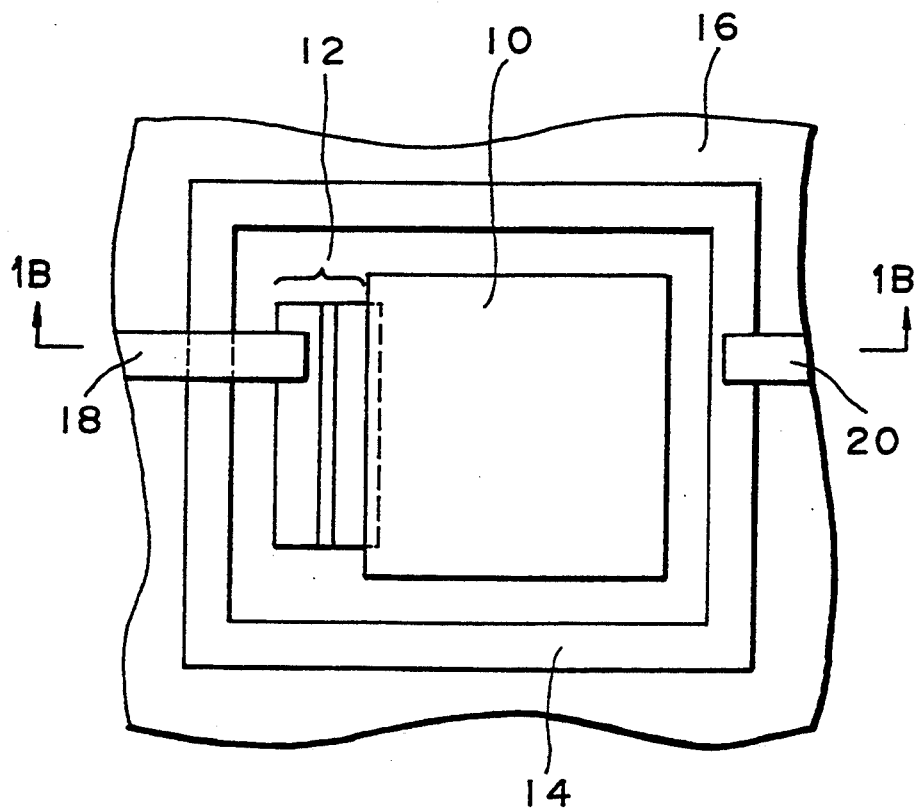
FIG. 1A and FIG. 1B are structural diagrams showing an embodiment of the semi-insulating compound semiconductor device according to the present invention.

Structure of a conventional semi-insulating compound semiconductor device will be described first with reference to FIG. 3 and then a semi-insulating compound semiconductor device of the present invention will be described as related to preferred embodiments thereof. Throughout the drawings, like reference numerals denote like elements.

Figure 3:
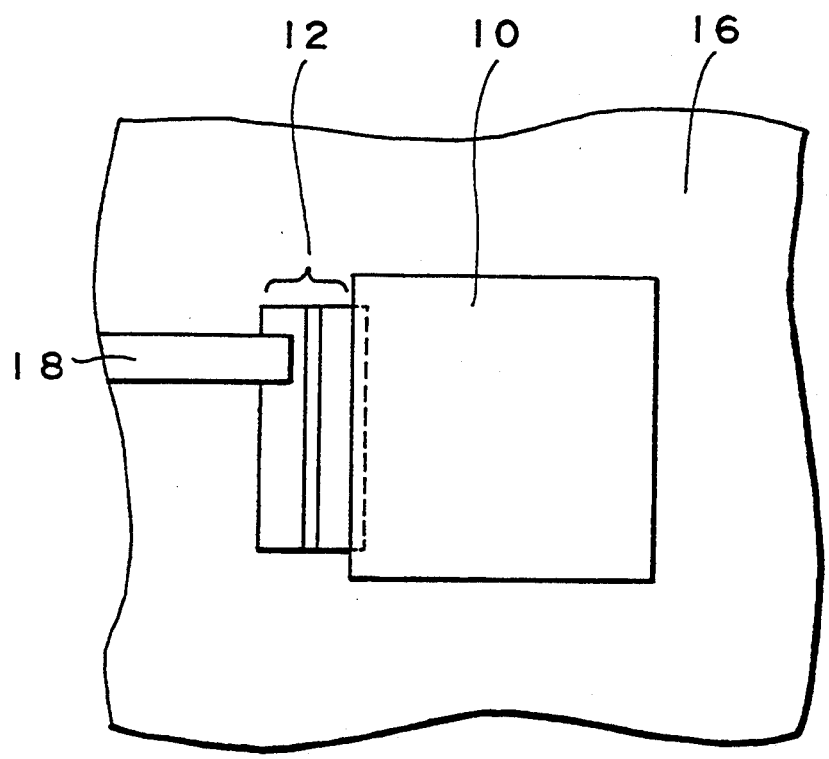
FIG. 3 is a structural diagram showing a typical example of prior art semi-insulating compound semiconductor devices.

FIG. 3 shows a structural diagram of a typical semi-insulating compound semiconductor device of the prior art. The semiconductor device comprises an input terminal portion 10, a protection diode 12, and an element formation region 16. Reference numeral 18 denotes GND. The protection diode 12 is formed of two diodes connected "back-to-back". The two diodes can be either of the p+-n30 type and the n+-p+ type.

Figure 1B:
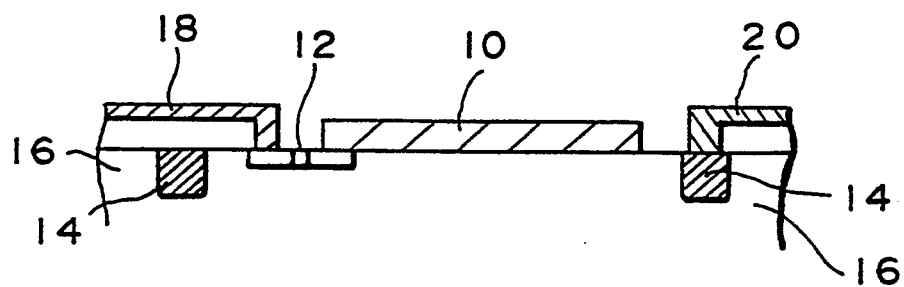

FIG. 1A shows, in a plan view, a structure of a first embodiment of the semi-insulating compound semiconductor device of the present invention. The semi-insulating compound semiconductor device of the first embodiment of the invention comprises an input terminal portion 10, a protection diode 12, a conduction region 14, and an element formation region 16. Details of the element formation region 16 are not shown. FIG. 1B shows a sectional view taken along line B—B in FIG. 1A.

The conduction region 14 is connected with $V_{DD}$ at its connection portion 20. The conduction region 14 is disposed between the input terminal portion 10 with the protection diode 12 connected thereto and the element formation region 16. Namely, the input terminal portion 10 and the protection diode 12 are separated from the element formation region 16 by the conduction region 14. It is preferable that the conduction region 14 is also disposed under the GND 18.

Figure 2A:
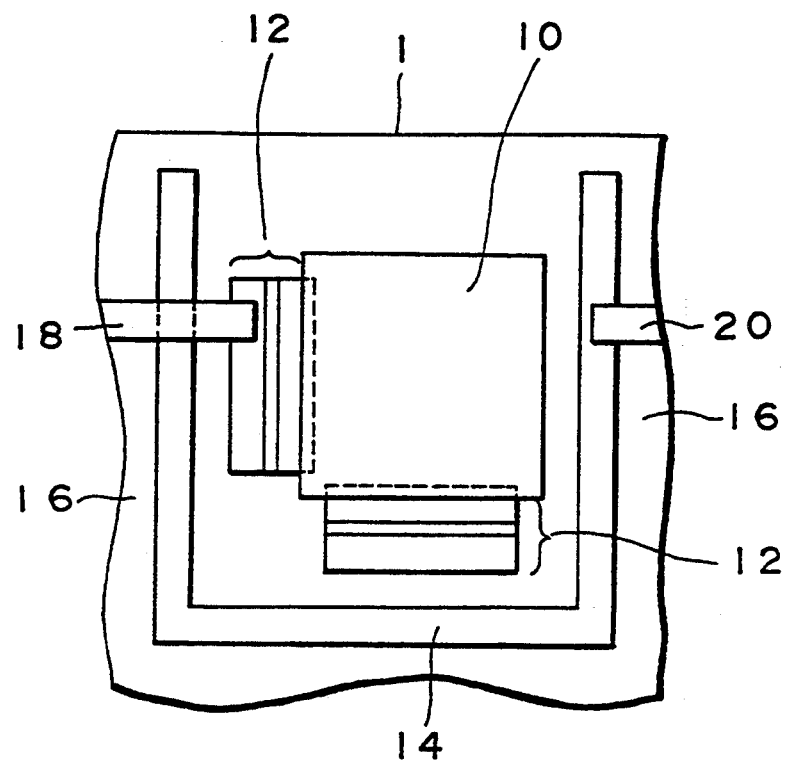
FIG. 2A and FIG. 2B are structural diagrams showing other embodiments of the semi-insulating compound semiconductor device according to the present invention.

In a second embodiment of the semi-insulating compound semiconductor device of the present invention shown in FIG. 2A, the input terminal portion 10 and the protection diode 12 are disposed at an edge portion 1 of the semi-insulating compound semiconductor device. This embodiment, different from the first embodiment, is provided with two protection diodes 12 connected to the input terminal portion 10. In the arrangement of this embodiment, the sides of the input terminal portion 10 and the protection diodes 12 not facing on the edge portion 1 are separated, for the most part, from the element formation region 16 by the conduction region 14.

Figure 2B:
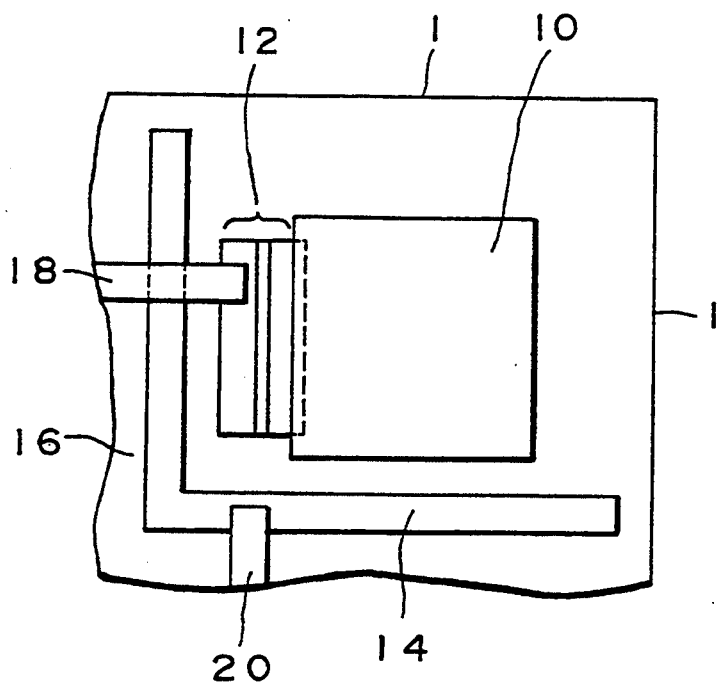

In a third embodiment of the semi-insulating compound semiconductor device of the present invention shown in FIG. 2B, the input terminal portion 10 and the protection diode 12 are disposed to face on two edge portions 1. In the arrangement of the third embodiment, the sides of the input terminal portion 10 and the protection diode 12 not facing on the edge portions 1 are separated, for the most part, from the element formation region 16 by the conduction region 14.

For example, each semi-insulating compound semiconductor device of the above described embodiments uses a power source of 10 V as $V_{DD}$ and can be driven with $V_{DS}$ set to 3 V, the source portion applied with a voltage of 3 V, and the bias point of the input terminal portion set to 2 V.

While, in the foregoing, the semi-insulating compound semiconductor device of the present invention has been described as related to the preferred embodiments, the present invention is not limited to such embodiments.

In the above described embodiments, though the conduction region 14 is connected with $V_{DD}$ which is the highest potential in the semi-insulating compound semiconductor device, the conduction region 14 can be connected with an independent wiring. Three or more of the protection diodes can be provided at the input terminal portion. The driving voltages of the semi-insulating compound semiconductor device can be suitably set up, depending on the specifications of semiconductor devices.

According to the present invention, the leakage current from the protection diode provided at the input terminal portion flows into the conduction region and, hence, the probability of the current flowing into the element formation region becomes very low. Accordingly, the action of the leakage current exerted on the element formation region can be eliminated. Therefore, the low-frequency oscillation of the drain current $I_D$ or drain conductance $g_m$ can be prevented in normal operating conditions and, thus, a semi-insulating compound semiconductor devices satisfactorily operating with stabilized characteristics can be obtained. As a result, low-frequency noises occurring in linear ICs can be prevented and malfunctions of digital ICs can be reduced.

What is claimed is:

1. A semi-insulating compound semiconductor device, comprising:
    an element formation region containing an element;
    an input terminal portion for said element on a surface of a part of said element formation region, said input terminal portion having a protection diode connected thereto;
    a conduction region at least partially surrounding the input terminal portion and protection diode and positioned between said input terminal portion and said element, said conduction region extending downwardly from said surface of said element formation region and terminating at a depth which allows an input path between said input terminal portion and a remainder of said element formation region containing said element; and
    said conduction region being connected to a potential which is sufficient to prevent low-frequency oscillation of said element.

2. A device according to claim 1 wherein said conduction region is connected to a highest potential of the semiconductor device.

3. A device according to claim 1 wherein said potential is chosen sufficiently high for preventing a low-frequency oscillation of at least one of a drain current or drain conductance of said element so that said conduction region absorbs the leakage current flowing through the protection diode.

4. A device according to claim 1 wherein said protection diode comprises two diodes connected back-to-back.

5. A device according to claim 1 wherein said protection diode is connected to ground and said conduction portion is connected to a highest potential in the semiconductor device.

6. A device according to claim 1 wherein said conduction region is a layer formed with a high-density n-type impurity.

7. A device according to claim 1 wherein said conduction region completely surrounds said input terminal portion and said protection diode.

8. A device according to claim 1 wherein said conduction region surrounds three sides of said input terminal portion and protection diode and on a fourth side an edge portion of the device is provided.

9. A device according to claim 1 wherein said conduction portion surrounds two adjacent sides of said input terminal portion and protective diode and opposite adjacent sides comprise edge portions of said device.

10. A semi-insulating compound semiconductor device, comprising:
    an element formation region containing a semiconductor device element;
    an input terminal for said semiconductor device element on a surface of a part of said element formation region, said input terminal having a protection diode connected thereto;
    a conduction region at least partially surrounding the input terminal and protection diode and positioned between said input terminal and said semiconductor device element, said conduction region extending downwardly from said surface of said element formation region and terminating at a depth which allows an input path between said input terminal and a remainder of said element formation region, said input terminal being an input for said semiconductor device element in said element formation region; and
    said conduction region being connected to a potential which is sufficient to prevent low-frequency oscillation of said semiconductor device element.

* * * * *